(12) United States Patent
Yasoda et al.

(10) Patent No.: US 6,892,616 B2
(45) Date of Patent: May 17, 2005

(54) CUTTING APPARATUS

(75) Inventors: Hisashi Yasoda, Ishikawa-ken (JP); Noriyuki Wakabayashi, Aichi-ken (JP); Takashi Tsuchida, Ishikawa-ken (JP)

(73) Assignee: UHT Corporation, Aichi-ken (JP)

( * ) Notice: Subject to any disclaimer, the term of this patent is extended or adjusted under 35 U.S.C. 154(b) by 170 days.

(21) Appl. No.: 09/991,638

(22) Filed: Nov. 26, 2001

(65) Prior Publication Data

US 2002/0069736 A1 Jun. 13, 2002

(30) Foreign Application Priority Data

| Nov. 28, 2000 | (JP) | ......................................... 2000-361561 |
| Nov. 28, 2000 | (JP) | ......................................... 2000-361562 |
| Oct. 25, 2001 | (JP) | ......................................... 2001-327796 |

(51) Int. Cl.$^7$ ............................................. B26D 5/08
(52) U.S. Cl. ........................ 83/62.1; 83/74; 83/640; 83/733; 29/560; 72/324
(58) Field of Search .................. 83/62.1, 631, 640, 83/859, 240, 733, 289, 371, 524, 697, 699.11, 411.1, 411.3, 411.7, 74, 75, 76.7, 583; 29/560; 72/324, 464

(56) References Cited

U.S. PATENT DOCUMENTS

| 4,541,405 A | * | 9/1985 | Schlough .................. 125/23.01 |
| 4,603,609 A | * | 8/1986 | Takatoshi ........................ 82/51 |
| 4,656,904 A | * | 4/1987 | Rayment et al. ............... 83/289 |
| 4,738,018 A | * | 4/1988 | Ebrahimian .................... 29/560 |
| 4,751,949 A | * | 6/1988 | Berner ...................... 144/162.1 |
| 5,079,981 A | * | 1/1992 | Singer et al. ................... 83/72 |
| 5,116,554 A | * | 5/1992 | Shinmoto ................... 264/40.1 |
| 5,269,739 A | * | 12/1993 | Maynard et al. ............... 483/29 |
| 5,521,707 A | * | 5/1996 | Castore et al. ............... 356/394 |
| 5,931,073 A | * | 8/1999 | Hoyer-Ellefsen ........... 83/471.3 |
| 6,070,509 A | * | 6/2000 | Lonn et al. ..................... 83/34 |
| 6,324,953 B1 | * | 12/2001 | Park ............................ 83/554 |
| 6,418,823 B1 | * | 7/2002 | Taitler ........................... 83/36 |
| 6,418,826 B1 | * | 7/2002 | Suzuki et al. ................. 83/111 |

* cited by examiner

Primary Examiner—Timothy V. Eloy
Assistant Examiner—Phong Nguyen
(74) Attorney, Agent, or Firm—Greenblum & Bernstein, P.L.C.

(57) ABSTRACT

A cutting apparatus is capable of cutting a work-piece depending upon the quality of the work-piece. The cutting apparatus produces parallelism between a knife edge of a cutting blade and a mounting face of the work-piece. A support having the blade is provided to a column capable of controlling a tilting angle of the blade in a blade length direction. Cutting is executed by controlling vertical movement of the blade. A driving source is capable of controlling movement linearly. The driving source produces a parallel relationship between a surface of a table and a knife edge. Different supports are each unitized to include a driving source and the blade vertically moved by the driving source. The different supports can be mounted interchangeably and selectively on a column of a cutting apparatus.

18 Claims, 13 Drawing Sheets

CUTTING APPARATUS

BACKGROUND OF THE INVENTION

1. Field of the Invention

The present invention relates to a cutting apparatus for cutting (e.g., cutting or half cutting) a work-piece such as a ceramics package, a laminated board of a ceramic green sheet, a non-ceramic film material, a ceramic capacitor, a flexible board, a plastic sheet, and the like.

2. Description of the Related Art

Various cutting apparatuses exist which are commonly equipped with cutting blades. For example, a cutting apparatus may be provided for cutting a work-piece while moving the cutting apparatus or a table on which the work-piece is mounted. Additionally, a cutting apparatus may be provided for cutting the work-piece mounted on an index table while feeding the cutting apparatus a fixed amount.

In the case of an index table, the cutting apparatus executes cutting while the cutting apparatus is fed by a fixed amount, including a time that the index table is turned by an angle 90 degrees.

In an example, e.g., a laminated board of ceramic green sheet, is half-cut before being sintered into, e.g., a lattice pattern. The cutting apparatus includes a column provided with a driving source. The cutting apparatus is capable of moving a cutting blade in a vertical direction by a prescribed amount. The column may also be capable of moving a index table mounted with the work-piece on its surface. A driving source, including a servomotor, is driven to move the column by a prescribed pitch in a longitudinal direction. After the work-piece mounted on the surface of the index table is half-cut in a shape of a strip, leaving a peripheral fringe portion, the index table is turned by an angle of 90 degrees. Similarly at the time the column is moved by a prescribed pitch in a longitudinal direction, the drive source is driven, the work-piece on the surface of the index table is similarly subjected to half cutting on a surface and a rear face, and rectangular tips are obtained by cracking the board after sintering. Half-cutting a board while leaving the peripheral fringe portion is performed so that marks for cutting are provided on the peripheral fringe portion. The marks remain in the product (chip in rectangular shape) obtained by sintering.

However, when cutting the laminated board of, e.g., the ceramic green sheet before sintering into, e.g., a lattice pattern, the above described process is executed only from a surface side of the work-piece.

There are various demands for cutting or half-cutting in the work-piece. For example, the ceramics package, the laminated board of ceramic green sheet, the non-ceramic film material, the ceramics capacitor, the flexible board, the plastic sheet, a product chip portion, may be the work-piece. A parallelism may be required in a relationship between a knife edge of a cutting blade and a table surface. Normally, the surface of the index table may be a slanted flat surface inclined in one direction.

When the parallelism is not realized, perfect cutting can not be conducted. For example, edge breakage may be caused by colliding the cutting blade with the table. Additionally, depths of the half cutting from the surface side and rear face become non-uniform.

Problems may occur when the depth of the half-cutting is non-uniform in the laminated board of, e.g., the ceramic green sheet, before sintering. For example after sintering a crack, tipping or exfoliation may occur in cracking, particularly in a laminated board having a recess portion of a SAW filter or the like on a surface side. When half cutting is executed from a position in proximity to the recess portion where a joining area between layers is small, cracking may easily occur at a peripheral wall portion of the recessed portion due to the dispersion force produced in cracking. Accordingly, a problem of exfoliation of layer occurs.

Conventionally, as a method of realizing the parallelism, jack bolts are used to mount members of the index table to the bed. The index table is gradually jacked up by the jack bolts, while a plurality of points are measured between the knife edge of the cutting blade and the table surface formed of the inclined flat surface. Therefore, mounting the index table to the bed is remarkably complicated, and a long period of assembling time is required.

SUMMARY OF THE INVENTION

In view of the forgoing conventional situation, an object of the present invention is to provide a cutting apparatus with parallelism by producing the parallelism in executing cutting. The parallelism is produced even when parallelism is not yet realized between the knife edge of the cutting blade and the surface of the table.

Another object of the present invention is to provide the cutting apparatus for cutting or half cutting depending upon properties of the work-piece.

According to an aspect of the present invention, the cutting apparatus includes a column provided with a support having the cutting blade. A tilting angle of the cutting blade in a blade length direction is controlled. The cutting blade is vertically movable relative to the support with the driving source provided on the support.

Referring to FIGS. 2, 5, 9, 10, 14 and 16, the blade length direction of the cutting blade is a (L) direction. The (L) direction is referred to as an X-axial direction, and a direction orthogonal to the (L) direction is referred to as an Y-axial direction.

The support is tilted in the blade length direction of the cutting blade. The support can be adjusted at a right angle to the table surface (table surface or surface of index table). The table surface includes a slant flat face inclined in one direction. Therefore, a parallel relationship can be realized between the table surface mounting the work-piece and the knife edge.

Further, when a parallelism with high precision is required between the table surface and the knife edge of the cutting blade, the cutting blade is lowered to be brought into line contact with the table surface. An image of a state thereof is taken and the pick-up image is processed (e.g., binary or multi-variable) by an image processing apparatus. Additionally, a fine control amount is calculated based on the data. Means for controlling a tilting angle of the cutting blade in the blade length direction in the support are also provided.

According to an aspect of the present invention, multiple cutting blade units, having differences in, e.g., driving sources, are provided. The multiple cutting blade units include the cutting blade, the support supporting the cutting blade, and the drive source provided on the support. The cutting blade unit is provided interchangeably on the column. Respective cutting blade units may be capable of controlling a tilting angle of the cutting blade in the blade length direction.

The driving source may be a source selected from, e.g., a servomotor, a hydraulic servomotor, a linear motor, an air cylinder, and a cam.

According to another aspect of the present invention, the cutting is enabled depending upon the quality of the work-piece.

Further, in a case where a vertically movable cutter supporting portion (cutter ram) is coupled to a plunger of the air cylinder, the apparatus is suited to constant speed cutting, and is advantageous in reducing cost.

Additionally, when the cutter supporting portion (cutter ram) is made vertically movable by a ball screw in which a screw rod directly connected to the servomotor as the drive source is fitted, a bottom dead center can be controlled and the high load cutting can be executed. When the cutter supporting portion (cutter ram) is made vertically movable by a driving force of the servomotor, via a boosted hydraulic circuit, not only can control of the bottom dead center be executed, but also a higher load can be cut than is possible with only the servomotor. Control of the bottom dead center and high load cutting are both suitable for half-cutting of a work-piece.

Furthermore, when a linear motor is used as a driving source to vertically move the cutter supporting portion (cutter ram), a high speed cutting is enabled. However, a cutting force may be weaker using the linear motor. Additionally, the bottom dead center and cutting speed can be adjusted with high precision, and a beautiful cutting face can be obtained.

Moreover, when the cutter supporting portion (cutter ram) is made vertically movable by a cam rotated by driving force of a motor, the apparatus is suited to repeat motion at a high and constant speed. However, the load applied is lower than when the servomotor is utilized as a drive source. The use of a cam is also advantageous in reducing cost.

As an example, the cutting blade units that use the air cylinder, the servomotor, the hydraulic servo motor, or the cam (used as a drive source for moving the cutting blade vertically), can be selectively utilized in cutting or half cutting of the various work-pieces.

When the air cylinder is adopted as the driving source for half-cutting, since a vertical reciprocating amount of the cutter supporting portion is constant (vertical moving amount), it is necessary for the air cylinder to apply a separate drive for reciprocating motion of the cutting blade. Accordingly, the apparatus is suited for cutting of components such as chips, cutting of outer periphery and the like, or for rough cutting. Further, since the servomotor can control respective positions of the top dead center and bottom dead center of the cutter supporting portion, an amount of half cutting can optionally be set and the apparatus is suited in half cutting of the ceramics package and products of chips.

Further, since the hydraulic servomotor is capable of executing higher load cutting than the servomotor, it is preferable in half cutting of a film (made of plastic), with the exception of, e.g., thick walled ceramics or the laminated board of ceramics green sheet.

Additionally, the linear motor is suited for cutting or half cutting of a work-piece of low viscosity where cracks are caused on the cutting surface when cutting speed is low.

Further, in the case where a cam is used, when the vertical reciprocating amount (vertical moving amount) of the cutter supporting portion is constant, a half cutting amount cannot be controlled. However, the apparatus with a cam is suitable for cutting of, e.g., a chip or cutting of an outer peripheral portion of the work-piece.

Furthermore, a sensing portion is provided. The sensing portion is movable in the blade length direction of the cutting blade. The sensing portion is provided parallel to the surface of the index table in a direction orthogonal to the blade length direction. The sensing portion may be mounted on the surface of the index table. The index table, the sensing portion, the driving source of the cutting blade, and means capable of controlling tilting angle of the support are respectively linked with the control portion.

The control portion may arithmetically process and store a tilting angle data of the cutting blade in the blade length direction by detecting a plurality of points of the knife edge in the blade length direction of the cutting blade. The detection by the sensing portion may occur as the blade length is lowered from an original point position (top dead center). The sensing portion may be mounted on the surface of the index table. The tilting angle data is sensed both before and after turning the index table by an angle of 90 degrees. The control portion may also arithmetically process and store a parameter of a lowering amount data of the cutting blade in cutting (including half cutting) of the work-piece. The processing may occur at the time the cutting blade is moved by a prescribed pitch from a driving amount of the driving source of the cutting blade. The knife edge is detected by the sensing portion. The cutting blade is lowered from the original point position (top dead center). The sensing portion senses the knife after the cutting blade moves a prescribed amount in a direction orthogonal to the blade length direction.

A full closed circuit may include the cutting blade, the driving source of the cutting blade, means to control the tilting angle of the cutting blade, the sensing portion, and the index table. The elements of the full closed circuit are linked with the control portion.

The sensing portion is a block body movable in parallel in the blade length direction of the cutting blade and mounted to be movable in a direction orthogonal to the blade length direction. The sensing portion also includes a contact body or an optical sensor. A contact body is controlled to move linearly in the blade length direction and has a top portion in parallel with the surface of the index table in a direction orthogonal to the blade length direction. The optical sensor can be provided in an opening of a movable body that can be controlled to move linearly in the blade length direction. The movable body is formed in a shape having an inner space. The size of the movable body does not interrupt movement of the cutting blade in a direction orthogonal to the blade length direction.

The sensing portion is mounted on the index table both before and after turning the index table by an angle of 90 degrees. The cutting blade is lowered from the original point position (top dead center). The sensing portion (block body, contact body, or optical sensor) is moved in a blade length direction. The cutting blade is lowered from the original point position (top dead center). The cutting blade may be detectable in any position of the knife edge (contact with knife edge for block body and contact body, or by optical amount blocked by lower end of knife edge for block body and optical sensor). One side in the blade length direction is detected by the sensing portion. The data is transmitted (output) to a center of the full close circuit. The sensing portion, for example, is moved to correspond to another side in the blade length direction to detect the other side. The data is transmitted (output) similarly to the control portion. A correction amount (deviated angle) between the knife edge of the cutting blade and the surface of the index table, i.e., tilting angle data, can be obtained using the data. Additionally, the detecting positions do not need to be both ends in the blade length direction. Rather, utilizing any two points is sufficient. The tilting angle data of the cutting blade may be obtained by trigonometric function by setting a cutting length in the blade length direction.

The cutting blade is moved by a prescribed amount in the longitudinal direction (Y-axial direction). The cutting blade is lowered from the original point position (top dead center), and detected with the block body and the contact body or the optical sensor. The driving amount of the driving source is arithmetically processed and stored in the control portion as a parameter of the lowering amount of the cutting length in cutting the work-piece. The parameter is processed and stored at the time of moving the cutting blade by a prescribed pitch. The cutting blade is lowered from the original point position (top dead center) by a prescribed pitch.

The control portion arithmetically processes the lowering amount data of the cutting blade from the parameter when cutting of the work-piece is carried out.

The above described tilting angle data and lowering amount data are utilized as data to carry out cutting of the work-piece mounted on the index table both before and after turning the index table by an angle of 90 degrees.

In an embodiment, when the block body described above is utilized, the block member may move not only in the blade length direction, but also a prescribed amount in parallel to the direction orthogonal to the blade length direction.

Further, the sensing portion is mounted on the surface of the index table for cutting of the work-piece. The respective index table, the sensing portion, the driving source of the cutting blade, and means capable of controlling the tilting angle of the support are linked with a control portion.

The control portion arithmetically processes the tilting angle data of the cutting blade in the blade length direction by detecting a plurality of the points of the knife edge in the blade length direction of the cutting blade. The sensing portion mounted on the surface of the index table detects the knife edge both before and after turning the index table by an angle of 90 degrees. A parameter of the lowering amount data is arithmetically processed and stored. The paramater is processed from the driving amount. The parameter is arithmetically processed and stored when the cutting blade is moved the prescribed amount in a direction orthogonal to the blade length direction of the cutting blade and the knife edge is brought into line contact with the index table.

According to another aspect of the invention, a full closed circuit includes a cutting blade, the drive source of the cutting blade, means for controlling the tilting angle of the cutting blade, the sensing portion, and the index table. The elements of the circuit are linked with the control portion.

A probe can be utilized for detecting a displacement amount by moving in the blade length direction and contacting the knife edge.

The tilting angle data, before and after turning the index table by an angle of 90 degrees, is sensed by the sensing portion (block body, contact body, optical sensor, probe or the like). The parameter of the lowering amount of the cutting blade is obtained by arithmetically processing the driving amount of the driving source. The parameter can also be obtained when the knife edge of the cutting blade moves in parallel to the index table, from data of the tilting angle when progressing or regressing the cutting blade by a prescribed amount, and lowering so as to bring the whole knife edge into line contact with the surface of the index table. The control portion arithmetically processes the lowering amount data of the cutting blade with the parameter.

The tilting angle data and the lowering amount data are utilized as data to carry out cutting of the work-piece mounted on the index table before and after turning the index table by an angle of 90 degrees.

Further, the index table may have an extractable positioning means mounted with the sensing portion.

That is, the sensing portion is positioned on the surface of the index table with excellent precision before and after turning the index table by an angle of 90 degrees. The positioning means are extracted during cutting and do not constitute an obstacle in cutting.

Further, according to an aspect of the invention, an index table for cutting the work-piece, the drive source of the cutting blade, and means for controlling the tilting angle of the support are linked with the control portion.

The control portion arithmetically processes the lowering amount of the cutting blade from the original point position (top dead center) from the driving amount of the driving source. The knife edge of one side and the other side of the cutting blade are brought into contact with the surface of the respective index table. The parameter of the lowering amount data may be arithmetically processed from the driving amount of the driving source when the cutting blade tilted according to the tilting angle data is moved a prescribed amount in a direction orthogonal to the blade length direction. The lowering amount data may be processed and stored when lowering the cutting blade from the original point position (top dead center), and when the knife edge is brought into line contact with the index table.

A full closed circuit may include the cutting blade, the driving source of the cutting blade, means for controlling the tilting angle of the cutting blade, and the index table. The circuit elements are linked with the control portion.

According to an aspect of the present invention, the control portion arithmetically processes the lowering amount of the cutting blade from the original point position (top dead center) after tilting the cutting blade in the blade length direction, by the driving amount of the driving source. Thus, the tilting angle data can be obtained and stored.

Further, the cutting blade tilted by the tilting angle data is moved in a longitudinal direction by a prescribed amount. The cutting blade is lowered from the original point position (top dead center). The knife edge is brought into line contact with the index table. The driving amount of the driving source is used as a parameter of the lowering amount of the cutting blade and stored in the control portion. The control portion arithmetically processes the lowering amount data of the cutting blade when moving the cutting blade by a prescribed pitch with the parameter.

The above described tilting angle data and the lowering amount data are utilized as data to carry out cutting of the work-piece mounted on the index table before turning the table by an angle of 90 degrees.

Further, after turning the index table by an angle of 90 degrees, another operation is executed. The tilting angle data and the lowering amount data is utilized as data to carry out cutting after turning the index table by an angle of 90 degrees.

Further, the sensing portion is utilized as means to sense the edge breakage or abrasion of the knife edge during an operation when the edge breakage or the abrasion will amount to equal to or more than prescribed range. Transmission means for transmitting information to an operator may be used to expedite a period of replacement of the cutting blade to the operator when the transmission means are linked with the control portion.

DESCRIPTION OF THE PREFERRED EMBODIMENT(S)

Figure 1:
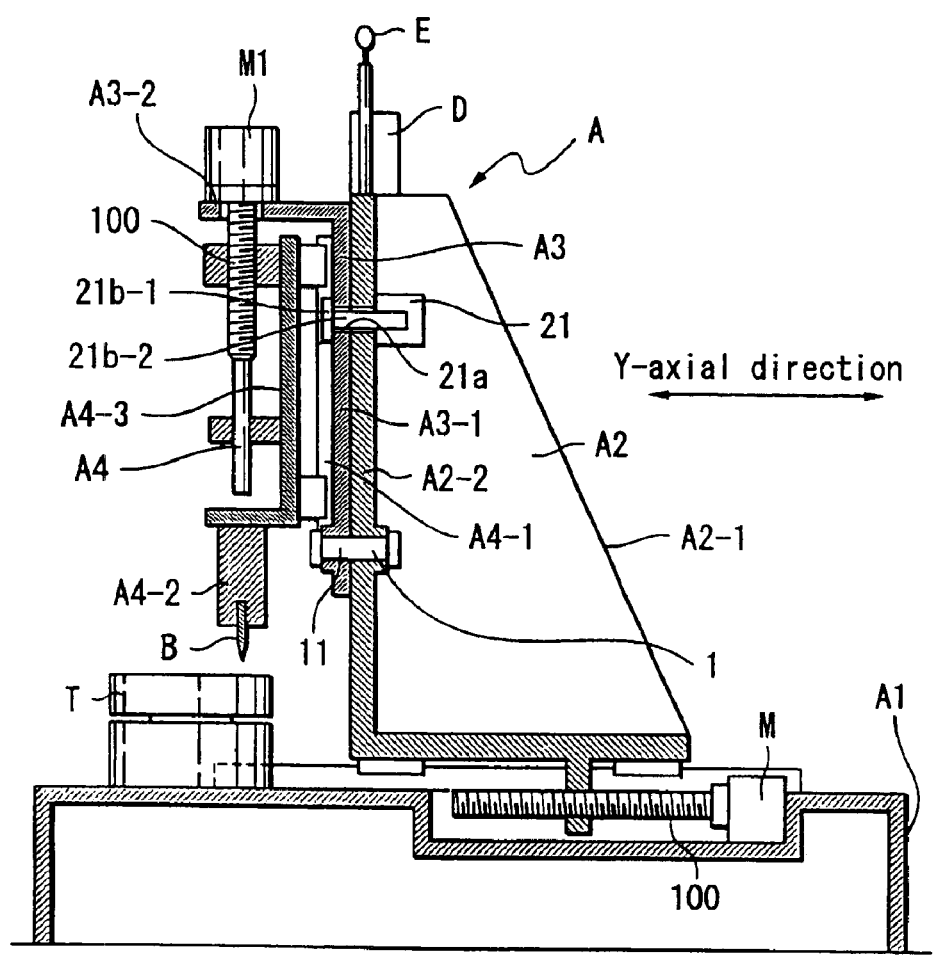
FIG. 1 is a front view of a first aspect of the invention.
Figure 2:
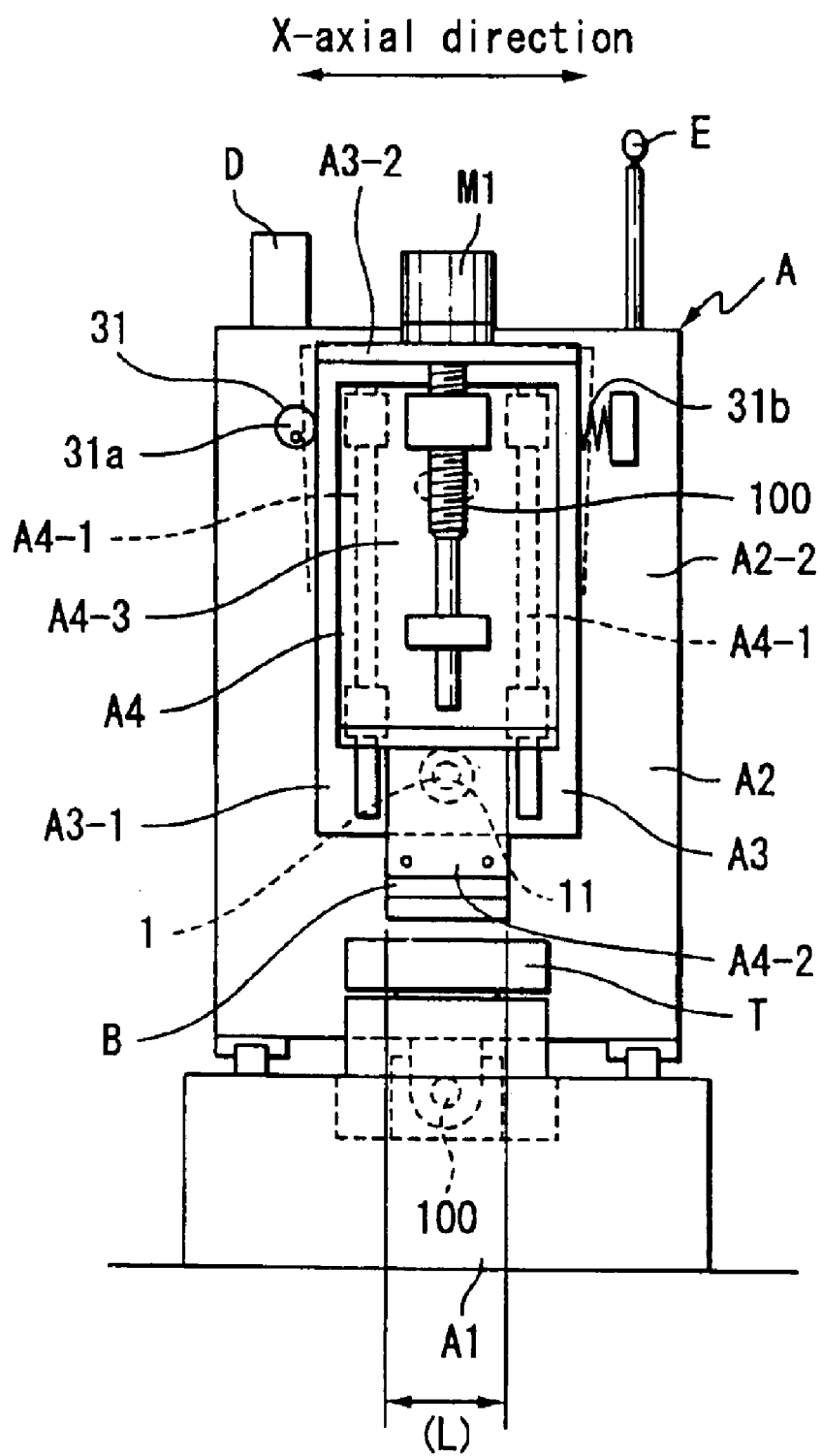
FIG. 2 is a sectional side view of a cutting apparatus of the first aspect of the invention.
Figure 3:
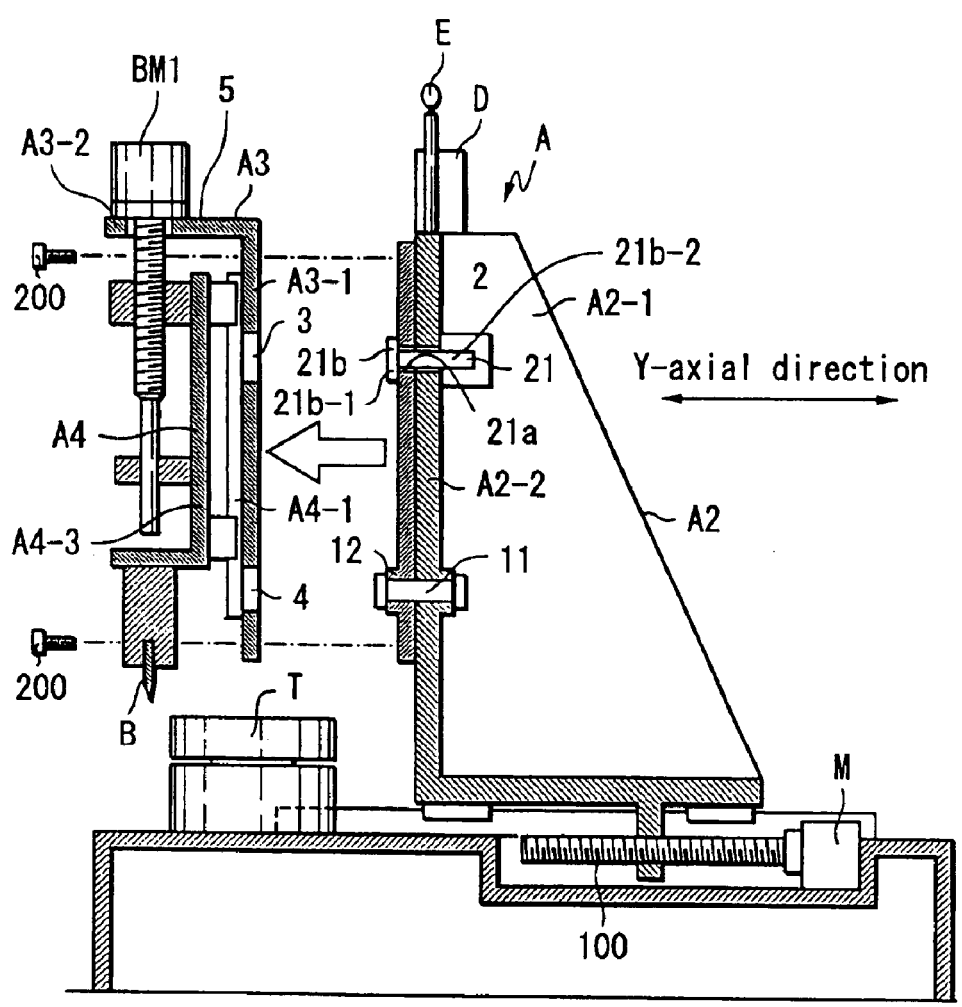
FIG. 3 illustrates a second aspect of the invention showing a sectional side view illustrating a state of removing a cutting blade unit.
Figure 4:
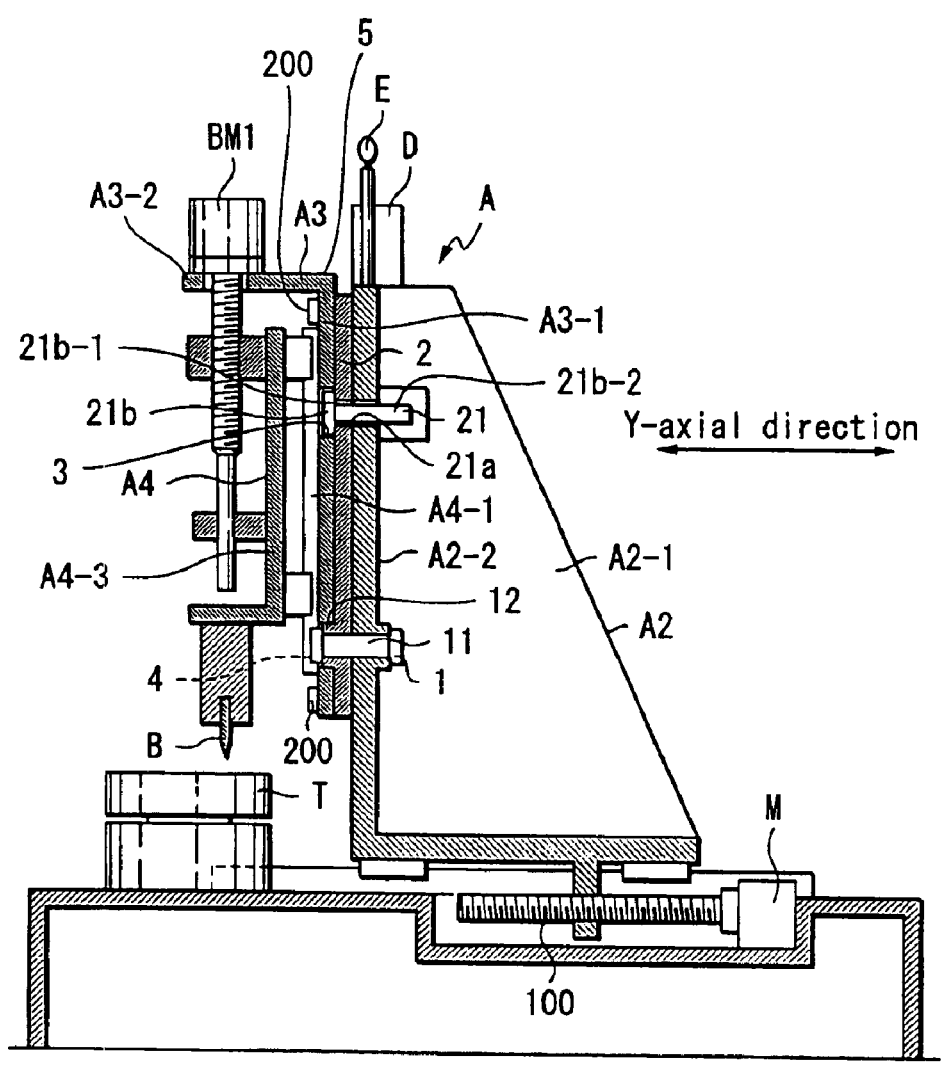
FIG. 4 is a sectional side view of the cutting apparatus.
Figure 5:
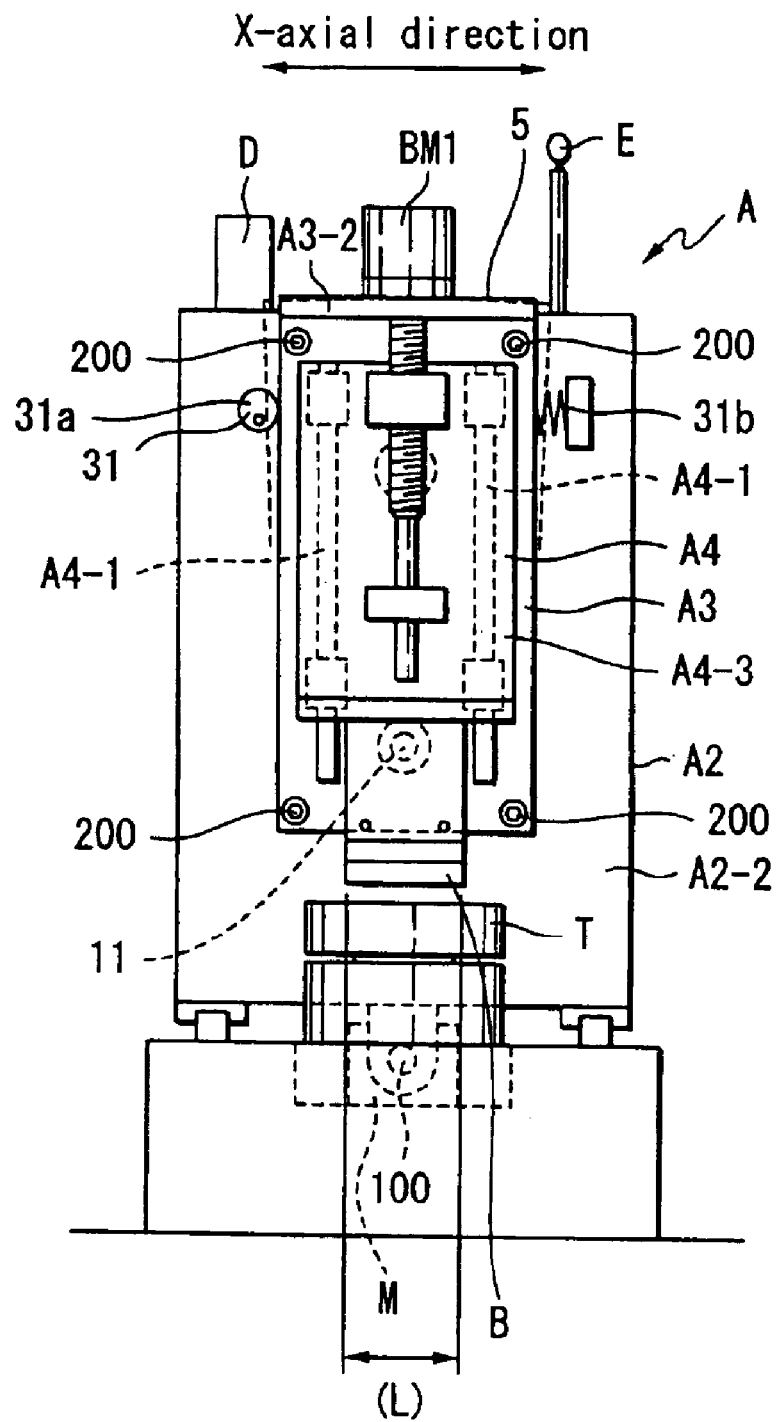
FIG. 5 is a front view of the cutting apparatus.
Figure 12:
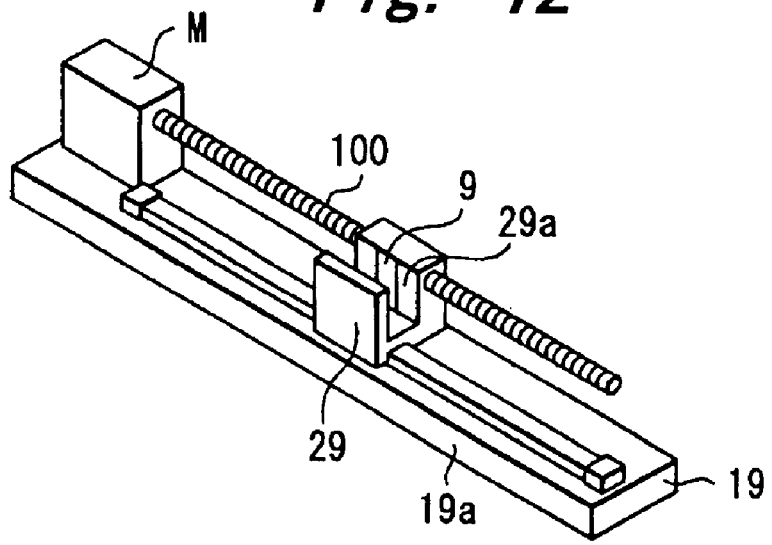
FIG. 12 illustrates a seventh aspect of the invention showing a perspective view of a jig utilized.
Figure 13:
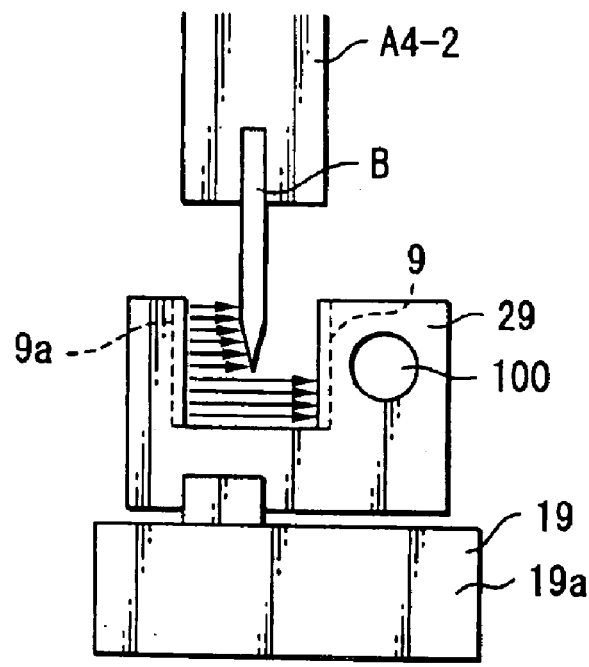
FIG. 13 is an enlarged side view.
Figure 14:
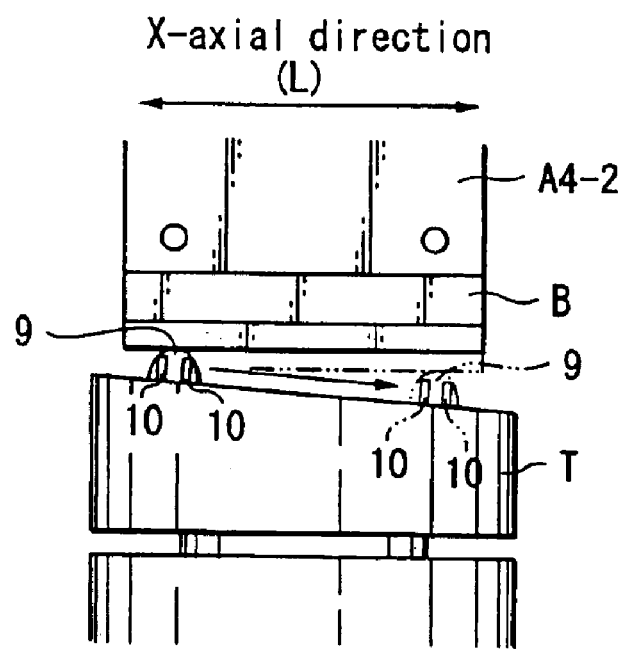
FIG. 14 is a front view, in an eighth aspect of the invention, illustrating a tilting angle data of the cutting blade and the deviation in parallelism between the index table and the knife edge.
Figure 15:
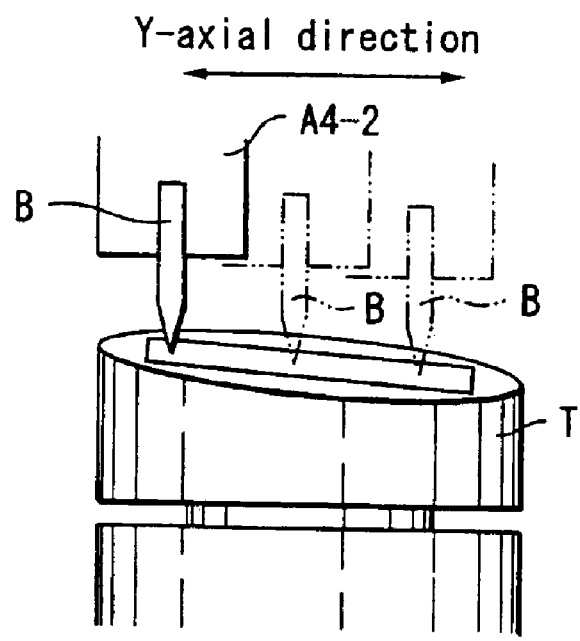
FIG. 15 is a side view, in the eighth aspect of the invention, illustrating a state of providing respective data of a driving amount of a driving source from an original point position (top dead center) when a total length of the knife edge is brought into line contact with the index table, and illustrating the deviation in parallelism between the index table and the knife edge of the cutting blade.
Figure 16:
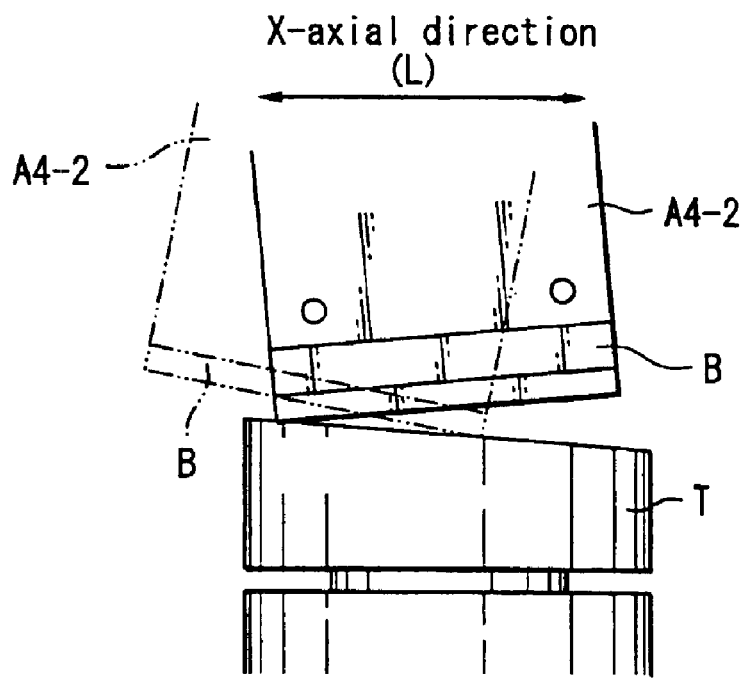
FIG. 16 is a front view illustrating a ninth aspect of the invention, illustrating an outline of a state of providing a tilting angle data, and illustrating the deviation in parallelism between the index table and the knife edge by exaggeration.
Figure 17:
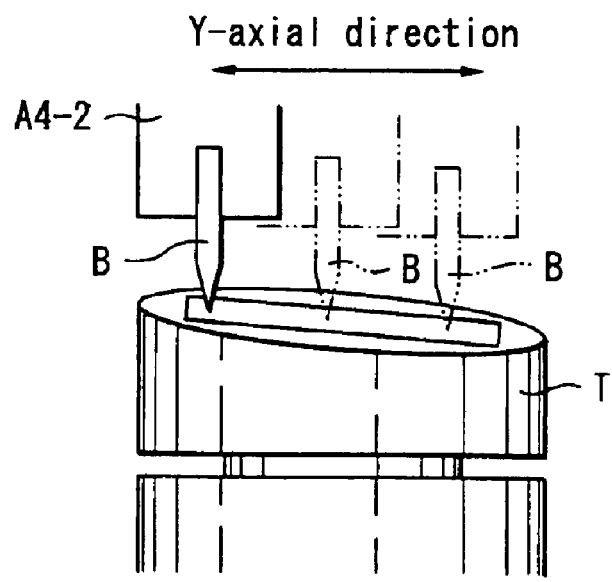
FIG. 17 is a side view, in the ninth aspect of the invention, illustrating an outline of a state of providing respective data of a driving amount of a driving source from an original point position (top dead center) when a total length of a knife edge of a cutting blade is brought into line contact with an index table, and illustrating a deviation in parallelism between the index table and the knife edge.

FIG. 1 and FIG. 2 show a cutting apparatus of a first aspect of the invention provided with a support having a cutting blade on a column. The support enables controlling a tilting angle in a blade length direction of the cutting blade. The cutting blade is vertically movable relative to the support by a driving source provided on the support. FIG. 3–FIG. 5 show a cutting apparatus wherein a cutting blade, a support supporting the cutting blade and a drive source provided on the support are unitized. A plurality of cutting blade unit types, differing in the sort of the drive source, are formed from the unitized elements. The cutting blade unit is provided on the column interchangeably. A tilting angle in a blade length direction of the cutting blade can be controlled. FIG. 12 and FIG. 13 show a cutting apparatus utilizing a sensing portion. FIG. 14 and FIG. 15 show a cutting apparatus utilizing another sensing portion. FIG. 16 and FIG. 17 respectively show a cutting apparatus not utilizing the sensing portion.

In FIG. 1 and FIG. 2, symbol A denotes the cutting apparatus and symbol T denotes an index table.

The cutting apparatus A is provided with a column A2 that can be controlled to move in a longitudinal direction, i.e., in a direction close to or separate from the index table T by a ball screw mechanism 100. The ball screw mechanism includes a servomotor as a drive source M provided on an upper surface of a machine bed A1. A support A3 is mounted on the column A2. A tilting angle can be controlled in a direction orthogonal to a moving direction being a moving direction of the column 2. A cutter mechanism A4 is vertically movable at the support A3 as illustrated in FIG. 1 and FIG. 2.

The index table T is installed above an upper face part of the machine bed A1 in front of the cutter mechanism A4 as illustrated in FIG. 1. Vacuum holes (not illustrated) are provided for temporally tacking a work-piece (not illustrated) on a machining face of a surface of the index table T.

The column A2 displays a channel shape in plan-view forming both parallel plate portions A2-1 and A2-1 in shapes of substantially rectangular triangle. Front plate portions A2-2 of the parallel plate portions A2-1 and A2-1 are constituted to be a support face of the support A3.

The support A3 displays an inverse L shape in side-view as illustrated. A vertical plate portion A3-1 is in a state of being brought into face contact with the front plate portion A2-2 of the column A2 described above and a tilting angle of a cutting blade B in a blade length direction (X-axial direction) can be controlled.

Means 1 for controlling the tilting angle include a central axis 11 for rotation inserted over a part of a lower end side in a central portion of the vertical plate portion A3-1 of the support A3 and the front plate portion A2-2 of the column A2. Means 1 also includes a brake mechanism 21 provided at a position directly above a central axis 11 for rotation, and a tilting force application mechanism 31 applying tilting force to the vertical plate portion A3-1.

A brake mechanism 21 maintain a tilting state. A hydraulic brake presses the support A3 to the front plate portion A2-2 of the column A2 with a head portion 21b-1. An axial portion 21b-2 of a clamping piston is inserted through the loose hole 21a opened at the vertical plate portion A3-1 of the support A3 and the front plate portion A2-2.

A magnetic brake or the like maybe acceptable in a brake mechanism 21.

The tilting force application mechanism 31 includes a cam (servomotor is utilized as drive source) 31a that pushes one side of the vertical plate portion A3-1 of the support A3. A damping spring 31b is provided at a part of the front plate portion A2-2, proximate to the other end of the vertical plate portion A3-1. The support A3 is tilted in a X-axial direction orthogonal to a blade length direction, against the damping spring 31b. The central axis 11 is rotated depending upon a rotating amount of the cam 31a.

The support A3 is tilted in a range where a inner face of the loose hole 21a meets the axial portion 21b-2 of the clamping piston 21b.

A piezoelectric element or a ball screw mechanism may freely be utilized in place of the cam 31a.

Guide rails A4-1 and A4-1 are vertically provided in parallel with each other on a surface of the vertical plate portion A3-1 of the support A3. A cutter ram A4-3 mounted with a cutter holder A4-2, having the cutting blade B at a lower portion, is vertically movably engaged with the guide rails A4-1 and A4-1 in a vertical direction. The cutter ram A4-3 is made vertically movable in the vertical direction by a ball screw mechanism 100 that includes a servomotor as a drive source M1 installed on a horizontal plate portion A3-2 of the support A3.

According to the cutting apparatus A, the support A3 is demountably mounted on the column A2. The column A2 controls the tilting angle in the blade length direction (X-axial direction).

Thereby, the index table T and a knife edge B are brought into a parallel relationship, and cutting and half cutting of the work-piece can be executed.

A symbol D denotes a control portion.

A cutting apparatus illustrated in FIG. 3–FIG. 5, and a cutting apparatus shown in FIG. 6, FIG. 7, and FIG. 8 will be explained in order. A support A3 is unitized as a drive source of a cutting blade B, and is interchangeably mounted on a column A2.

A cutting blade unit 5 is provided with the support A3 and supports a servomotor as a drive source BM1. A cutter mechanism A4 is provided vertically movably with respect to the support A3 as illustrated in FIG. 3.

The support A3 is displayed as an inversed "L" letter shape, similar to the invention illustrated in FIG. 1 and FIG. 2. A drive source BM1, i.e., a servomotor, is installed above a horizontal plate portion A3-2.

In the support A3, guide rails A4-1 and A4-1 are vertically provided in parallel with each other on a surface of a vertical plate portion A3-1. A cutter ram A4-3, mounted with a cutter holder A4-2, is engaged with the guide rails A4-1 and A4-1. The cutter ram A4-3 is vertically movable using a screw rod coupled to a servomotor BM1. The screw rod is threaded in a ball screw provided in the cutter ram A4-3.

The column A2 is provided with a ball screw mechanism 100 including the servomotor as the drive source M. The drive source M is provided above an upper face of the machine bed A1. The column A2 is displayed in plan-view having both parallel plate portions A2-1 and A2-1 in the shape of a substantially rectangular triangle.

Means 1 for controlling the tilting angle in the blade length direction (X-axial direction), as illustrated in FIG. 3–FIG. 5, include a medium plate 2 interposed between the vertical plate portion A3-1 of the support A3 and the front plate portion A2-2 of the column A2. The means 1 also include the center axis 11 for rotation inserted over a lower portion of the medium plate 2 and a lower portion of the front plate portion A2-2. The brake mechanism 21 is provided in a position directly above a center axis 11 for rotation. The means 1 also include the tilting force application mechanism 31 for applying the tilting force to the medium plate 2. The support A3 is mounted by fastening screws 200 (bolts) to the medium plate 2.

The brake mechanism 21 maintains the tilting state. The brake mechanism 21 utilizes a hydraulic brake to press the medium plate 2 to the front plate portion A2-2 of the column A2 by the head portion 21b-1. The shaft portion 21b-2 of the clamping piston is provided with a head portion 21b-1. The head portion 21b-1 contacts the face of the medium plate 2. The shaft portion 21b-2 is inserted through the loose hole 21a opened on the medium plate 2 and the front plate portion A2-2. In an embodiment, a magnetic brake or the like may be acceptable as the brake mechanism 21.

A containing hole 3 in the vertical plate portion A3-1 contains the head portion 21b-1 of the clamping piston 21b. A fitting hole 4 fits a boss 12, projected from the medium plate 2. The fitting hole 4 fits the boss 12 at a portion that includes the central axis 11 for rotation. The support A3 is fastened by screws 200 (bolts) when the support A3 is brought into contact with the surface of the medium plate 2, such that the head portion 21b-1 of the clamping piston 21b is contained in the containing hole 3, and the boss 12 is fitted in the fitting hole 4.

The tilting force application mechanism 31 includes the cam 31a (utilizing the servomotor as drive source) 31a for pushing one side of the medium plate 2. The tilting force application mechanism 31 also includes a damping spring 31b in proximity to the other end of the medium plate 2. The cutting blade unit 5 is fastened by screws 200 (bolts) together with the medium plate 2. Depending upon a rotary amount of the cam 31a, the cutting blade unit 5, together with the medium plate 2, is tilted in an X-axial direction (blade length direction of cutting blade) in a range in which an inner face of the loose hole 21a meets the axial portion 21b-2 of the clamping piston 21b. The cutting blade unit 5 is tilted by pushing the medium plate against the damping spring 31b, centering on the central axis 11 for rotation. Of course, the piezoelectric element or the ball screw may be utilized in place of the cam.

After controlling a tilting angle of the knife edge in the X-axial direction (blade length direction of cutting blade), control of the tilting angle of the cutting blade unit 5 is maintained. In particular, in a state of being parallel to the index table T by the rotation of the cam 31a, the brake mechanism 21 is operated and, together with the medium plate 2, the control of the tilting angle of the cutting blade unit 5 is maintained.

Accordingly, the cutting blade unit 5 provided with the cutter mechanism A4, and including the servomotor as the drive source BM1, is mounted on the column A2.

Thereby, an index table T is parallel with the knife edge B, so that cutting of the work-piece can be executed.

Figure 6:
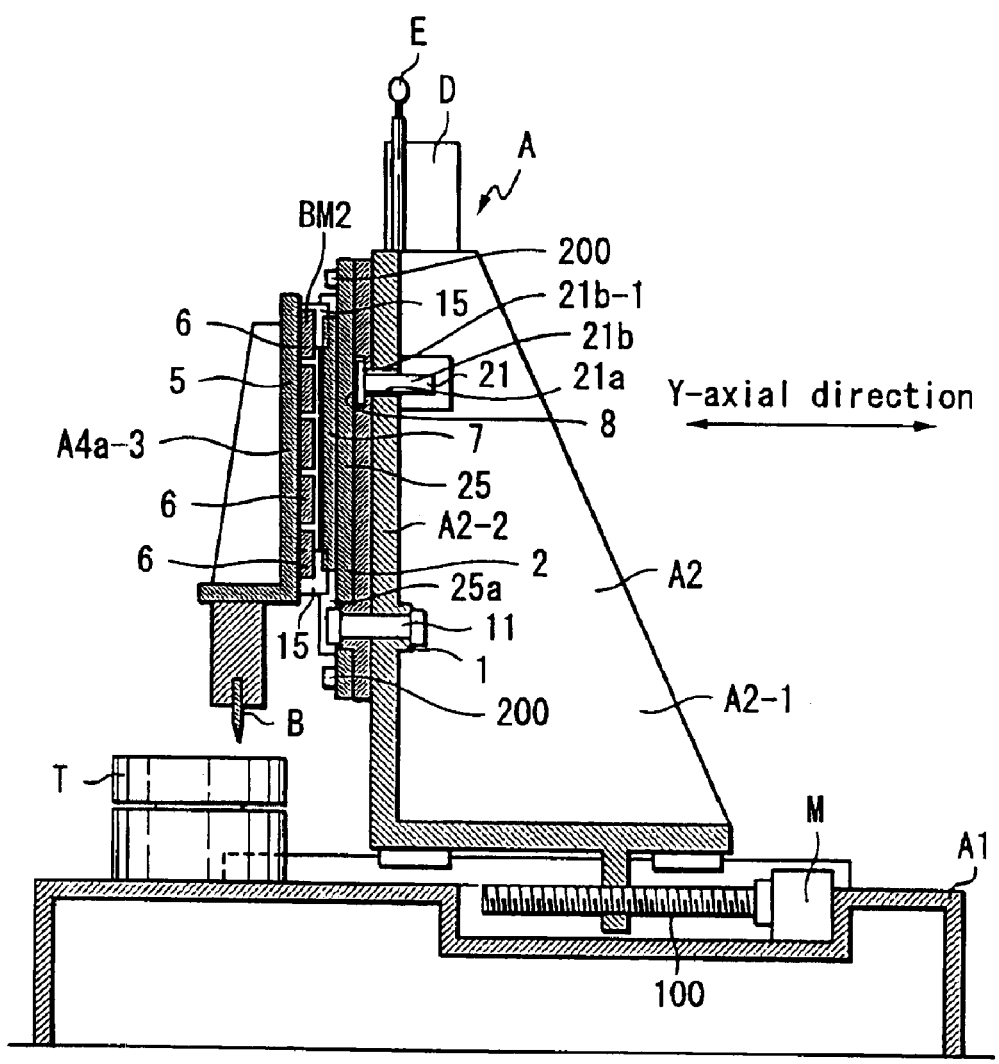
FIG. 6 illustrates a third aspect of the invention showing a sectional side view of a cutting apparatus having a cutting blade unit utilizing a linear motor as a driving source.

FIG. 6 shows the cutting apparatus A utilizing a cutting blade unit 5 including a linear motor as a drive source BM2.

The cutting blade unit 5 is provided with engaging portions 15 on a rear face of a vertical plate portion A4a-3 of a cutter ram A4-3. A pair of guide rails 25a are projected in parallel at a guide plate 25. The guide plate 25 is provided in parallel to a vertical plate portion A4a-3. Engaging portions 15 are vertically movably engaged with the guide rails 25a. A linear motor BM2 includes coils 6 of a linear motor BM2. The coils 6 are vertically arranged between the engaging portions 15. Magnets 7 are provided at the surface of the guide plate 25 with a clearance between the guide rails 25a. The guide plate 25 is mounted to the medium plate 2 by the screws 200 (bolts).

The lower end side of the medium plate 2 is axially supported by the central axis 11 for rotation inserted through the front plate portion A2-2 of the column A2.

The means 1 for controlling the tilting angle in the blade length direction (X-axial direction) include the brake mechanism 21 and the tilting angle application mechanism 31 for applying tilting force to the medium plate 2. A containing recessed portion 8 is provided for containing the head portion 21b-1 of the clamping piston 21b. The containing recessed portion 8 has a clearance between the rear face of the guide plate 25 corresponding to a position where the clamping piston 21b of the brake mechanism 21 is provided in the medium plate 2. The cutting blade unit 5 may be slanted such that the knife edge in the X-axial direction (blade length direction of cutting blade) becomes parallel to the index table T by the rotary amount of the cam 31a of the tilting force application mechanism 31. A controlled titling angle can be maintained in a state where the knife edge B is in parallel with the machining face of the index table T by pushing the medium plate 2 to the front plate portion A2-2 of the column A2 with the operating brake mechanism 21.

Figure 7:
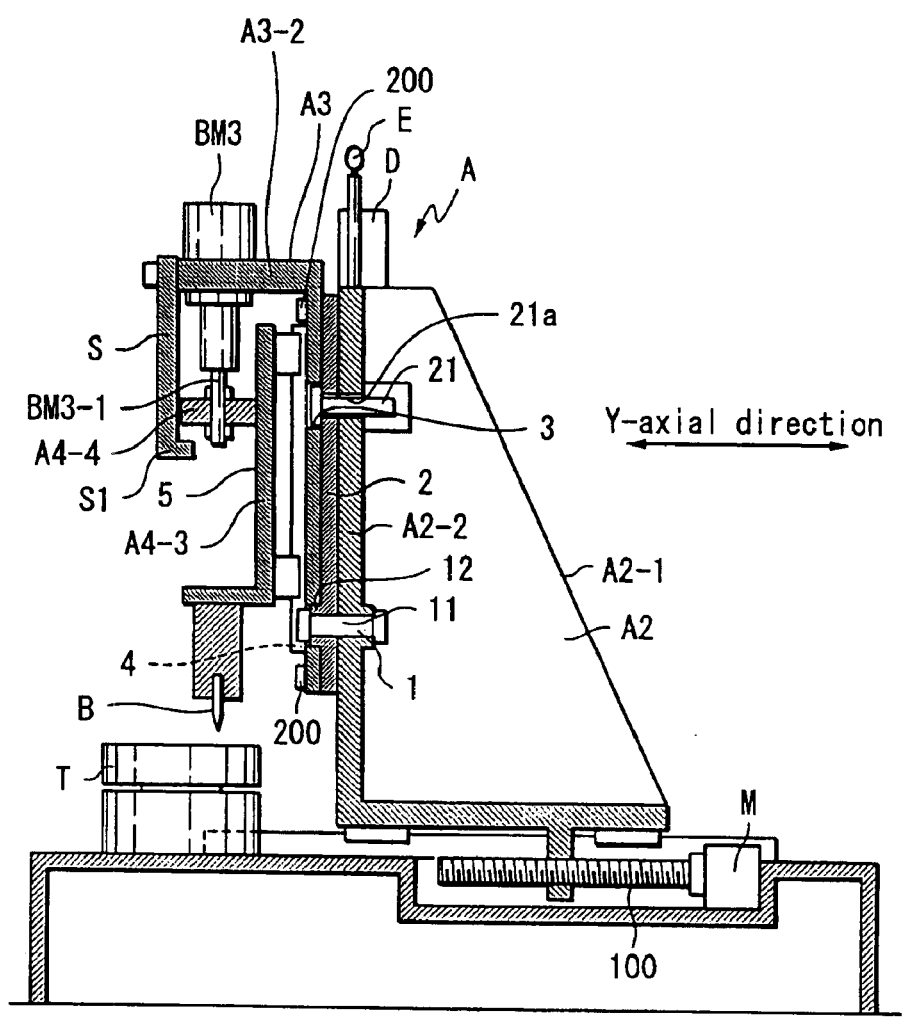
FIG. 7 illustrates a fourth aspect of the invention showing a sectional side view of a cutting apparatus having a cutting blade unit utilizing an air cylinder as a driving source.

FIG. 7 illustrates the cutting apparatus A utilizing a cutting blade unit 5, including an air cylinder as a drive source BM3.

The cutting blade unit 5 is an example of making the cutter ram A4-3 illustrated in FIG. 3–FIG. 5 vertically movable using an air cylinder BM3. The cutter ram A4-3 is provided with a coupling portion A4-4 for coupling a plunger BM3-1 of the air cylinder BM3. A stopper body S has a stopper portion S1 at a lower end thereof. The coupling portion A4-4 abuts the stopper portion S1 to set the bottom dead center of the cutting blade B to a prescribed value. The stopper body S hangs from the front end of the horizontal plate portion A3-2 of the support A3.

Figure 8:
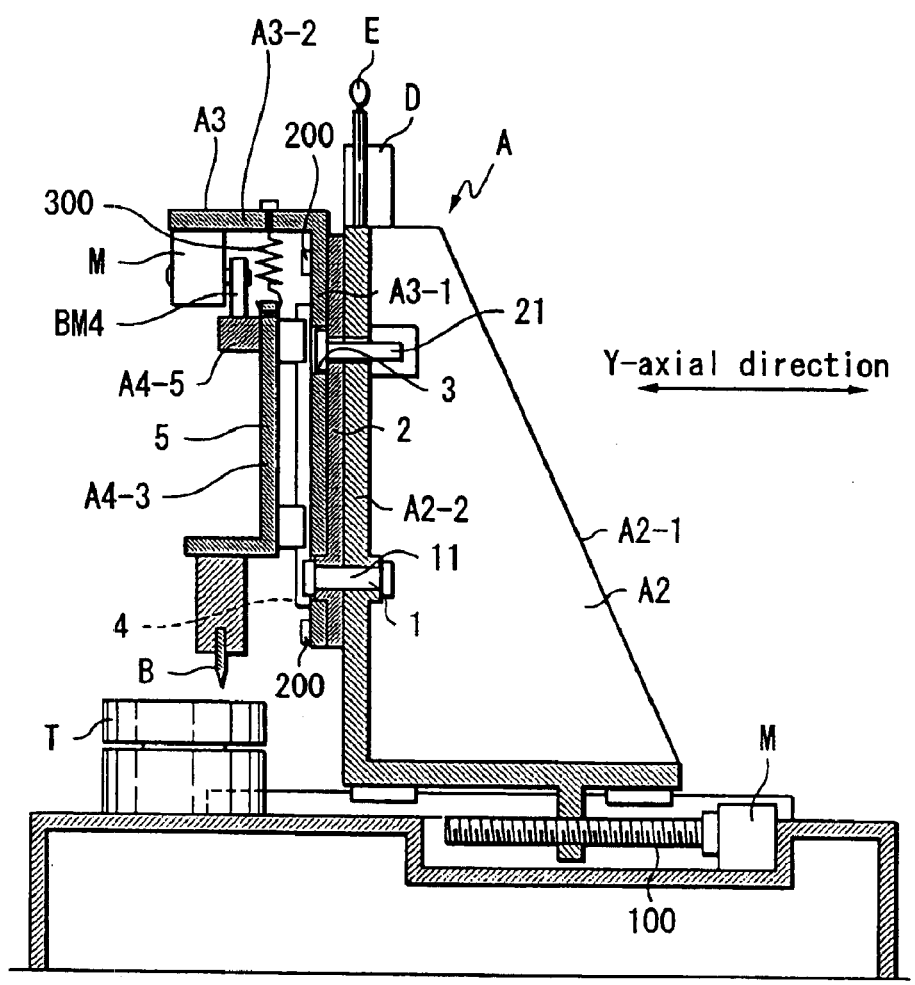
FIG. 8 illustrates a fifth aspect of the invention showing a sectional side view of a cutting apparatus having a cutting blade unit utilizing a cam as a driving source.

FIG. 8 illustrates the cutting apparatus A utilizing the cutting blade unit 5, including a cam as a drive source BM4.

The cutting blade unit 5 is provided with a servomotor M on a lower face of the horizontal plate portion A3-2 of the support A3. The cutter ram A4-3 is vertically moved by pushing a push-moving portion A4-5 that projects from the cutter ram A4-3. A cam BM4 is driven to rotate by the servomotor M to push the push-moving portion A4-5. A tension spring 300 interposed over the horizontal plate portion A3-2 counteracts the pushing by the push-moving portion A4-5.

A cutter ram is vertically moved by synchronizing the output of a boosting hydraulic circuit with a servomotor.

Respective cutting blade units 5 illustrated in FIGS. 3–5, FIG. 6, FIG. 7 and FIG. 8 are fastened by the screws 200 (bolt) to the medium plate 2 in the cutting apparatus 5, and are interchangeable thereamong.

Figure 9:
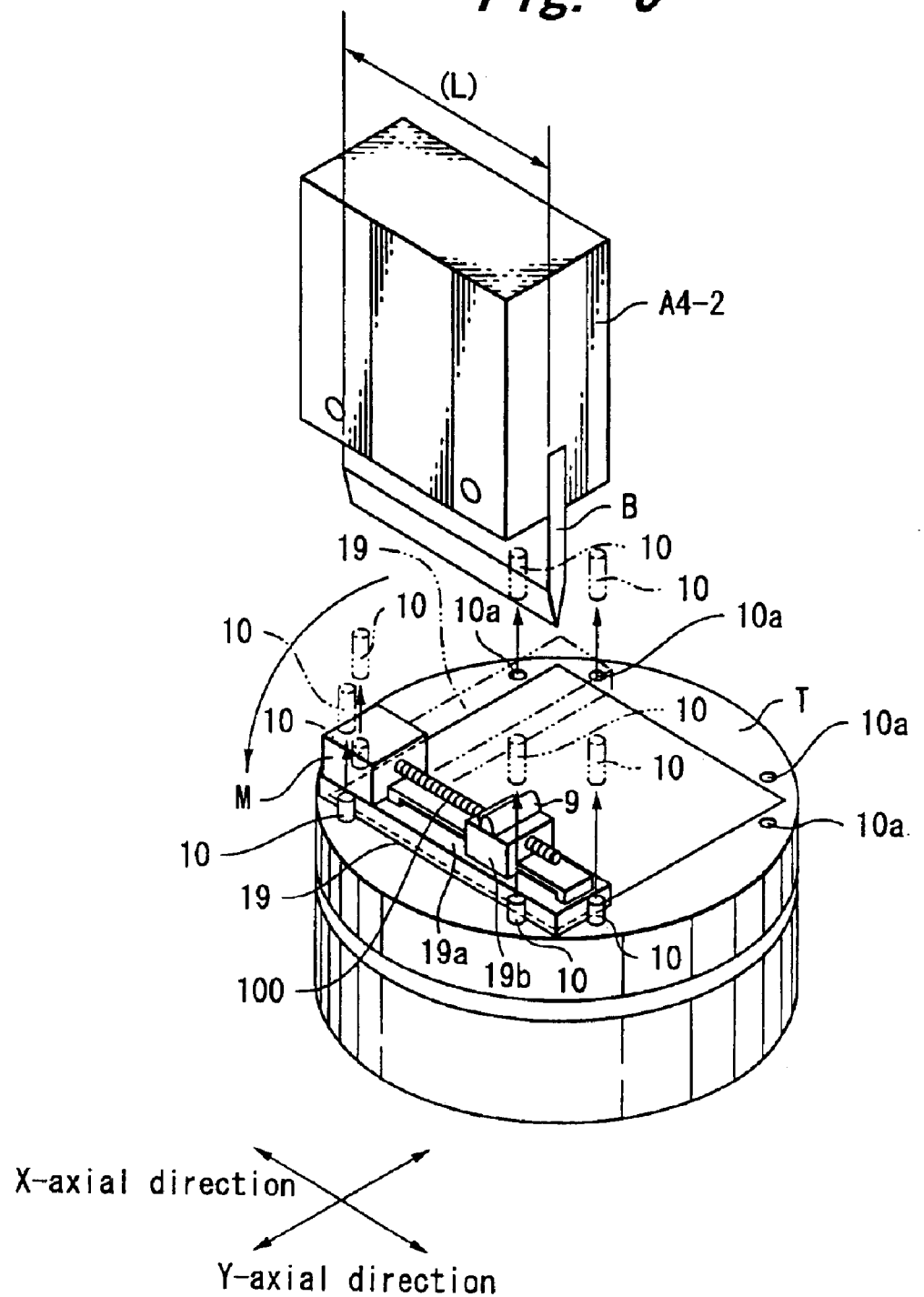
FIG. 9 illustrates a sixth aspect of the invention showing a perspective view of a portion illustrating a relationship among an index table, a sensing portion mounted on a surface of the index table, and a cutter ram having a cutting blade at a lower end thereof.
Figure 10:
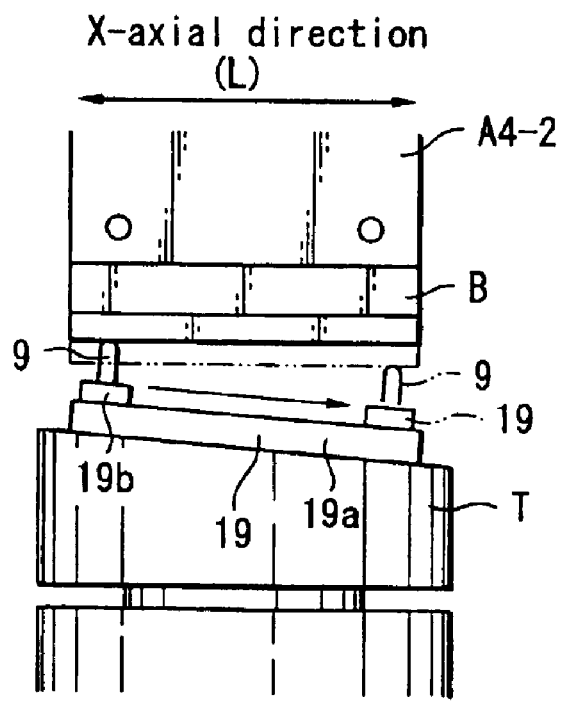
FIG. 10 is a front view, in a sixth aspect of the invention, illustrating an outline of a state of providing a correction amount (deviated angle) of a knife edge with respect to a surface of an index table by detecting one side and another side in a blade length direction (X-axial direction) by a sensing portion.
Figure 11:
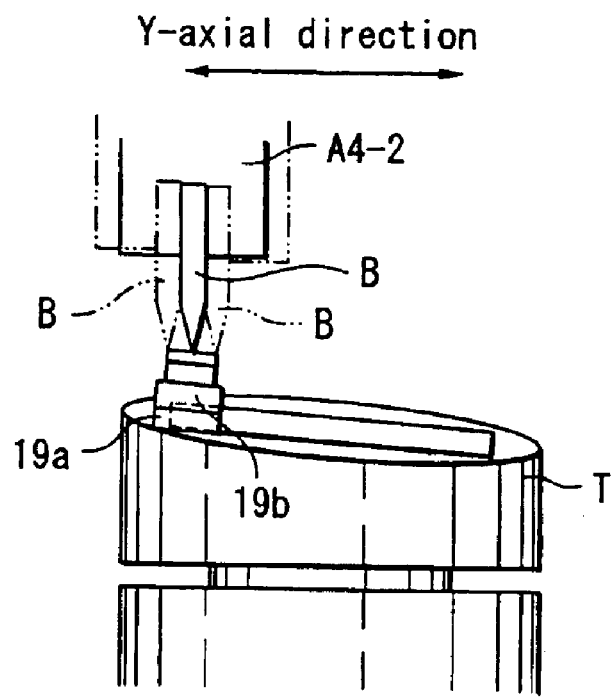
FIG. 11 is a side view, in the sixth aspect of the invention, illustrating an outline of a state of providing respective data of a driving amount of a driving source from an original point position (top dead center) by detecting the cutting blade by the sensing portion after moving the cutting blade by a prescribed amount in a Y-axial direction, and lowering the cutter blade from the original point position (top dead center)

FIG. 9–FIG. 11 shows the cutting apparatus A producing the parallelism between the index table T and the cutting blade B by utilizing a sensing portion 9.

Respective drawings illustrate a relationship between the cutting blade B and index table T.

The sensing portion 9 is a contact body movable in a blade length direction of the cutting blade B. A top portion of the sensing portion 9 is parallel to a surface of the index table T in a direction orthogonal to the blade length direction. The sensing portion 9 is provided in a jig 19.

A servomotor is installed to one side of an upper face support base 19a. The upper face support base is rectangular shaped with a vertical cross section. A lower face of the upper face support base 19a is brought into contact with the surface of the index table T and an upper face of is formed parallel to the lower face. A mounting stand 19b is controlled to move linearly on the support base 19a in the longitudinal direction. A ball screw mechanism 100 with a servomotor M as a drive source is provided on the other end from the mounting stand 19b. The ball screw mechanism 100 moves the mounting stand 19b. The sensing portion 9 is mounted on an upper face of the mounting stand 19b.

Although a linear movement distance for the mounting stand 19b is preferably a distance longer than the blade length of the cutting blade B, a distance shorter than the blade length will also be accepted.

The sensing portion 9 is formed substantially in a bullet shape in a vertical sectional view having a cross width size of the mounting stand 19b. The top portion is parallel to the upper face of the support base 19a over the whole length in the length direction. In other words, the top section of the sensing portion 9 is parallel to the surface of the index table T.

Symbol 10 denotes a plurality of positioning means (positioning pins) for positioning the support base 19a in the blade length direction of the cutting blade B. The positioning means are brought into contact with side faces of the support base 19a. The positioning pins position the jig 19 mounted on the surface of the index table T in the blade length direction of the cutting blade B before or after turning the index table by an angle of 90 degrees. The positioning pins can be extracted when not needed. Symbol 10a denotes an inserting hole thereof.

A full closed circuit includes a cutting blade B, the drive source for vertically moving the cutting blade B (e.g., M1, BM1, BM2), the brake mechanism (hydraulic circuit) 21, the driving source M of the cam 31a of the means 1 to control the tilting angle of the cutting blade, the jig 19 (including the contact body 9), and the index table T. The elements of the circuit are electrically linked with the control portion D.

The control portion D includes an operation portion that arithmetically processes tilting angle data of the cutting blade. The tilting angle data is processed by detecting a plurality of points of the knife edge using the sensing portion (contact body) 9 mounted on the surface of the index table T, both before and after turning the index table T by an angle of 90 degrees. The operation portion arithmetically processes a parameter of lowering amount data of the cutting blade. The knife edge is detected when lowered from the original point position (top dead center), after the cutting blade B is moved by a prescribed amount in a direction orthogonal to the blade length direction. The control portion also includes a storing portion for storing the tilting angle data, and the parameter.

The parameter is a coefficient of gradient (ratio of gradient between a prescribed moving distance and a lowering amount up to bottom dead center) of the surface of the index table T. The coefficient is obtained from the driving amount of the driving source (e.g., M1, BM1, and BM2) when the knife edge is detected by the sensing portion (contact body) 9.

For example, when the cutting blade B is moved by 5 cm from the fixed point, the cutting blade is lowered from the original point position (top dead center) and detection is executed by the sensing portion (contact body) 9. The lowering amount from the original point position (top dead center) is obtained as 10.1 cm, and a lowering amount from the original point position (top dead center) is 10 cm at the fixed point (before moving cutting blade). For lowering the cutting blade B from the original point position (top dead center), the coefficient of gradient is calculated as 0.1 cm/5 cm.

A procedure of calculating a parallelism between the cutting blade B and the index table T in a cutting apparatus A will be described.

Positioning means (positioning pin) 10 are brought into contact with side faces of the support base 19a and a jig 19 is mounted on the surface of the index table T.

The jig 19 becomes parallel to the blade direction (X-axial direction) of the cutting blade B by a positioning function of the positioning means 10. When the cutting blade B is moved directly above the jig 19, the sensing portion (contact body) 9 is brought into a direction (Y-axial direction) orthogonal to the blade length direction of the cutting blade B.

Further, the sensing portion (contact body) 9 is, for example, moved to be positioned directly below one side in the blade length direction. In that state, the cutting blade B is lowered from the original point position (top dead center) and the knife edge is brought into contact with the top portion of the sensing portion (contact body) 9. The driving amount of the driving source M1, BM1, and BM2, from the original point position (top dead center) until the knife edge is brought into contact with the sensing portion (contact body) 9, is detected. The data is transmitted (output) to the control portion D. The knife edge lowering from the original point position (top dead center) is then brought into contact with the top portion of the sensing portion (contact body) 9. The sensing portion 9 is capable of moving to another side of the upper force support base 19a in a blade length direction. The sensing portion detects the lowering amount, and transmits (outputs) data of the drive amount of the driving source M1, BM1, and BM2 to the control section D (refer to FIG. 11).

The control section D arithmetically processes a correction amount (deviated angle) according to the relative magnitude of parallelism between the knife edge B and the index table T using both of the data and stores the data to RAM.

The cutting blade B is then moved by a prescribed amount in a direction orthogonal to the blade length direction, that is, in Y-axial direction. The cutting blade B is lowered from the original point position (top dead center) and brought into contact with the top portion of the sensing portion (contact body) 9, and a lowering amount (driving amount of driving source M1, BM1, and BM2) from the original point position (top dead center) is transmitted (output) to the control portion D (refer to FIG. 11).

The control portion D arithmetically processes the parameter (coefficient of gradient) from the data. The lowering amount data (first lowering amount data) is used in cutting of the work piece (not illustrated) when moving the cutting blade by a prescribed pitch in Y-axial direction based on the parameter (coefficient of gradient). The control portion D stores the data in RAM.

The process described above operates similarly even when the index table T is turned by an angle of 90 degrees. The second tilting angle data and second lowering amount data are stored in the control section (RAM).

When cutting is carried out, the control portion D controls the cam 31a, based on the first tilting angle data, to tilt the support A3 or the cutting blade unit 5 in a blade length direction (X-axial direction) such that the knife edge B is in parallel with the surface of the index table T. The brake mechanism 21 is controlled, and the tilting angle is maintained.

Additionally, height data from the top portion of the sensing portion (contact body) 9 to the half cut position of the work-piece (not illustrated) is added to the first lowering amount data. The cutting blade B is lowered from the original point position (top dead center), and the work-piece is cut in half cutting. Of course, when cutting is applied instead of half cutting, the height data from the top portion of the sensing portion (contact body) 9 to the surface of the index table T is added and cutting is carried out.

When cutting is carried out after turning the index table by an angle of 90 degrees, the height data from the top portion of the sensing portion (contact body) 9 up to the half cut position of the work-piece is added to the second lowering amount data and half cutting is carried out. When cutting is carried out instead of half cutting, height data from the top portion of the contact body up to the index table T is added to the second lowering amount data and cutting is carried out.

In FIG. 12 and FIG. 13 the sensing portion 9 includes an optical sensor for detecting the position of the knife edge B.

The sensing portion 9 and the jig 19 are described now.

The sensing portion (optical sensor) 9 is provided at inside of a movable body 29 formed in an upward opening type (upwardly directed channel shape). The movable body 29 includes an inner space 29a of desired width size not interrupting movement of the knife edge in a direction orthogonal to the blade length direction. The movable body 29 is moved linearly on the upper face of the support base 19a, using the servomotor as a drive source M.

The sensing portion (optical sensor) 9 is arranged along one inner side face of the inner space 29a of the movable body 29. A light emitting element 9a is provided on the one inner side face opposite to the sensing portion (optical sensor) 9 on the other inner side face of the inner space 29a of the movable body 29. The sensing portion 9 detects the photo amount not blocked by the knife edge B, and transmits (output) data to the control portion D.

Further, the inner space 29a is utilized as a space for moving the cutting blade B when the cutting blade is moved in the Y-axial direction by a prescribed amount, and when the cutting blade B is lowered from the original point position (top dead center).

A procedure to produce the parallelism between the cutting blade B and the index table T A will be explained.

Since the procedure is similar to that described previously, except that detection is carried out by a change in the optical amount in the present embodiment.

In FIG. 14 and FIG. 15 a block body mounted on the index table T directly is utilized as the sensing portion 9 to produce the parallelism between the cutting blade B and the index table T.

A relationship between the cutting blade and the index table is illustrated.

A bottom face of the block body 9 faces the surface of the index table T. A position of the sensing portion (block body) 9 can be changed by a plurality of positioning means (positioning pins) 10 on the surface of the index table T. The sensing portion 9 can be positioned at both end portions of the knife edge portion in respective states before and after turning the index table by an angle of 90 degrees.

Further, in a state where the sensing portion (block body) 9 is positioned on one end side of the blade length direction (X-axial direction), the cutting blade B is lowered from the original point position (top dead center), and the knife edge thereof is brought into contact with the top portion of the sensing portion (block body) 9. Data of the driving amount of the driving source (M1, BM1, and BM2) is transmitted (output) to the control portion D. Succeedingly, in a state where the sensing portion (block body) 9 is positioned to the other end in the blade length direction (X-axial direction). The cutting blade is lowered from the original point position (top dead center). The knife edge is brought into contact with the top of the sensing portion (block body) 9. Data of the driving amount of the driving source M1, BM1, and BM2 is transmitted (output) to the control portion D (FIG. 14).

The control portion D arithmetically processes the correction amount (deviated angle), in relation to the relative parallelism between the knife edge B and the index table T by utilizing both data (first tilting angle data before turning the index table T by an angle of 90 degrees and second tilting angle data after turning the table T by an angle of 90 degrees). The data is stored in the RAM.

Further, the sensing portion (block body) 9 is removed. A plurality of positioning means (positioning pins) 10 are extracted. The cutting blade B, tilted according to the first tilting angle data and the second tilting angle data, is moved in Y-axial direction by a prescribed amount. The cutting blade B is lowered to be brought into line contact with the surface of the index table T. The lowering amount from the original point position (top dead center) up to the bottom dead center (cutting blade is brought into face contact with surface of index table T), according to the driving amount of the driving source M1, BM1, and BM2. The parameter is arithmetically processed and stored in the RAM (FIG. 15).

The control portion D arithmetically processes the first lowering amount data and the second lowering amount data of the cutting blade.

When cutting is carried out (when it is carried out before turning index table T by an angle of 90 degrees), the control portion D controls the cam 31a based on the first tilting angle data and tilts the support A3 and the cutting blade unit 5 in the blade length direction (X-axial direction) so as to be in parallel to the surface of the index table T. The brake mechanism 21 is controlled and the tilting angle is maintained.

Further, when moving the support A3 or the cutting blade unit 5 by a prescribed pitch in Y-axial direction by the control portion D, a half cut position of the work-piece is subtracted from the first lowering amount data. Half cutting of the work-piece is executed by lowering the cutting blade. Of course, in case of cutting instead of half cutting, the cutting is executed according to the lowering amount data.

When cutting is carried out after turning the index table T by an angle of 90 degrees, cutting is carried out by utilizing the second tilting angle data and second lowering amount data.

Next, obtaining the first and the second tilting angle data, and the first and second lowering amount data without utilizing the sensing portion 9 will be described with reference to FIG. 16 and FIG. 17.

As illustrated in FIG. 16, in a state where the cutting blade B is tilted at same angle (e.g., 5 degree) in both directions of the blade length direction (X-axial direction). Both end portions of the knife edge B are lowered from the original point position (top dead center), and brought into contact with the surface of the index table T. The control portion D arithmetically processes the lowering amounts from both original point positions (top dead center) by the driving amount of the driving source M1, BM1, and BM2, and thereby provides the tilting angle data.

Further, the cutting blade B is tilted according to the tilting angle data, when moving the column A2 having the cutting blade B by a prescribed amount in Y-axial direction. The cutting blade B is lowered from the original point position (top dead center). The knife edge B is brought into line contact with the index table. The parameter (coefficient of gradient) of the lowering amount of the cutting blade B from the original point position (top dead center) is used, and data is stored in the control portion (refer to FIG. 17).

The control section D arithmetically processes the data based on the parameter as a lowering amount data of the cutting blade. The cutting blade is lowered from the original point position (top dead center) when moving the cutting blade by a prescribed pitch in Y-axial direction.

Tilting angle data and the lowering amount data are obtained both before and after turning the index table T by an angle of 90 degrees.

According to the embodiments shown in FIG. 9–FIG. 15, a probe for being brought into contact with the knife edge B and detecting the displaced amount may be utilized as the sensing portion 9.

The probe can be moved linearly on the mounting stand. The tilting angle data and lowering amount data are obtained.

Further, the sensing portion 9 and the probe (sensing portion) can be utilized as a sensing means of the edge breakage of the knife edge B during cutting of the work-piece, particularly a laminated board such as ceramic green sheet having an electrode circuit.

The sensing portion 9 is positioned in the blade length direction (X-axial direction) of the cutting blade by the positioning means 10. While moving the sensing portion 9 linearly by a prescribed amount in the blade length direction (X-axial direction), the knife edge is sensed over its entire length by lowering the cutting blade from the original point position (top dead center). The control portion D is built with a determining circuit for determining whether the edge breakage or abrasion in the cutting blade causes incapacitance of use by comparing the reference data stored in the RAM of the control portion D and data of change in the driving amount of the driving source M1, BM1, and BM2.

Of course, a transmitting means E is linked to the control portion D. When the edge breakage or the abrasion is caused to be equal to or more than an allowable range, since yield of the product is lowered, the transmitting means E transmits the information to the operator.

The transmitting means is designed to appeal to the visual sense or auditory sense of the operator by presenting the information by e.g., an alarming sound, a lamp, a buzzer and the like.

As a result of the transmission, the cutting blade B can be exchanged, and cutting with excellent precision can be realized.

The edge breakage (including abrasion) is inspected periodically.

As described above, the present invention proposes a convenient cutting apparatus such that the support having the cutting blade in the column is provided, the support is capable of controlling the tilting angle in the blade length direction of the cutting blade. Since the cutting blade is vertically movable relative to the support by the drive source provided on the support, the work-piece can be cut by maintaining the knife edge in parallel to the mounting surface of the work-piece (surface of table).

Moreover, different driving sources, such as a servomotor, an air cylinder, a linear motor, a hydraulic servomotor, a cam or the like. The driving source enables the cutting blade to be vertically movable by receiving a driving force of the driving source. The driving source and cutting blade are unitized, and selectively and replaceably mounted to the column. Therefore, by effectively utilizing the characteristics of respective driving sources, the work-piece with any of low viscosity, high viscosity, high hardness, low hardness, fragile brittleness, or the like can be subjected to cutting or half cutting.

Accordingly, cutting of the work-piece with no need of high precision cutting can be carried out. Cutting of the work-piece with high hardness can be carried out. Cutting of the work-piece of low viscosity can be carried out. Cutting of the work-piece of high viscosity can be carried out. Rough cutting suitable for various situation of the work-piece may be carried out. High precision cutting can be carried out. The present invention provides the convenient cutting apparatus by selecting and replacing the cutting apparatus and carrying out the cutting operation. Therefore, edge breakage or cutting failure. Exfoliation of layers, crack or the like is prevented from occurring.

Particularly in a case where the servomotor, hydraulic servomotor, or linear motor is utilized as the drive source, when a work-piece is cut at a prescribed pitch while moving the cutting blade by a prescribed pitch, the cutting blade can be controlled to a position of the bottom dead center which is coincident with the cutting depth. The cutting blade can be gradually displaced at every cutting due to the slant of the mounting face The cutting apparatus is particularly preferable in cutting or half cutting needing the high precision.

Additionally, when the sensing portion is currently utilized, the parallelism between the index table and the cutting blade can be produced with high precision and the work-piece can be subjected to cutting. A troublesome and complicated operation, such as obtaining the parallelism between the knife edge and the surface of the table while manually jacking up the index table gradually by jack bolts, and measuring a plurality of points by a micrometer, is no more required.

Moreover, the sensing portion is provided with a contact body which is capable of being moved linearly in the blade length direction. The sensing portion may have a top portion in parallel with the surface of the index table and may be directed in a direction orthogonal to the blade length direction. The sensing portion may include an optical sensor for detecting a position of the knife edge. The optical sensor is provided inside of the movable body with an upward opening, which is capable of being controlled to move linearly. The movable body includes an inner space of desirable width size that does not interrupt movement of the cutting blade in a direction orthogonal to the blade length direction. Execution data for cutting the work-piece can be obtained by a manual operation to position the sensing portion so as to be capable of moving linearly along the blade length direction. When turning the index table by an angle of 90 degrees, operability is thereby remarkably improved.

Furthermore, the sensing portion can be positioned at a regular position so as not to produce hindrance in cutting.

Additionally, when the sensing portion is not utilized, the knife edge and the mounting face (surface of index table) of the work-piece can be placed in parallel, and excellent precision cutting can be executed.

What's more, the sensing portion can be used as a means for detecting the edge breakage of the knife edge during cutting of the work-piece. When the control portion determines the edge breakage or abrasion, the information is transmitted to the operator via the transmitting means and the replacement of the cutting blade can be expedited.

Having described specific preferred embodiments of the invention with reference to the accompanying drawings, it will be appreciated that the present invention is not limited to those precise embodiments, and that various changes and modifications can be effected therein by one of ordinary skill in the art without departing from the scope of the invention as defined by the appended claims.

What is claimed is:

1. A cutting apparatus comprising a column and a support supporting a cutting blade having a knife edge, said support being configured to control a tilting angle of the cutting blade in a blade length direction, and the cutting blade being driven to be vertically movable relative to the support by a driving source supported by said support;

wherein an index table having a surface for positioning a work-piece, a driving source of the cutting blade, and a tilter configured to control the tilting angle of the support are respectively linked with a controller; and wherein said controller processes and stores a tilting angle data by collecting a driving amount of the driving source of the cutting blade as the cutting blade being tilted in the blade length direction relative to the surface of the index table, the tilting angle data being processed by bringing a one end side of the knife edge and an opposite other end side of the knife edge into contact with the surface of the index table by lowering the cutting blade from an original top dead center position, in a state where said cutting blade is slanted by a same angle respectively on the one end side and the opposite other end side in the blade length direction both before and after turning said index table by an angle of 90 degrees, and wherein said controller processes and stores a parameter of a lowering amount data of the cutting blade at a time of moving the cutting blade by a prescribed pitch, from a driving amount of the driving source of the cutting blade, by bringing the knife edge of the cutting blade into line contact with the index table, by lowering the cutting blade from the original top dead center position by moving the cutting blade tilted by the tilting angle data, by a prescribed amount in a direction orthogonal to the blade length direction.

2. A cutting apparatus as set forth in claim 1, wherein a plurality of cutting blade units are provided, each having a different driving source, and each including a cutting blade, the support supporting the cutting blade, and the drive source provided above the support, each cutting blade unit being interchangeably provided to the column, each cutting blade unit being configured to control the tilting angle of the cutting blade in the blade length direction.

3. A cutting apparatus as set forth in claim 2, wherein at least one of said driving sources is a servomotor.

4. A cutting apparatus as set forth in claim 2, wherein at least one of said driving sources is a hydraulic servomotor.

5. A cutting apparatus as set forth in claim 2 wherein at least one of said driving sources is a linear-motor.

6. A cutting apparatus as set forth in claim 2, wherein said driving source is one of a servomotor, a hydraulic servomotor, a linear motor, an air cylinder, and a cam.

7. A cutting apparatus as set forth in claim 1, wherein the support controls the cutting blade to tilt within a plane of the cutting blade.

8. A cutting apparatus comprising a column and a support supporting a cutting blade, said support being configured to control a tilting angle of the cutting blade in a blade length direction, and the cutting blade being driven to be vertically movable relative to the support by a driving source supported by said support, wherein a sensing portion, movable in a blade length direction of a lowering cutting blade and extending parallel relative to a surface of an index table in a direction orthogonal to the blade length direction, is mounted on the surface of the index table, wherein the index table, the sensing portion, the driving source of the cutting blade, and a tilter configured to control the tilting angle of the support are respectively linked with a controller;

wherein said controller processes and stores a tilting angle data of the cutting blade in the blade length direction by detecting a plurality of points of a knife edge in the blade length direction, using said sensing portion mounted on the surface of the index table, both before and after turning the index table by an angle of 90 degrees, and wherein said controller further processes and stores a parameter of a lowering amount data of the cutting blade at a time of moving the cutting blade by a prescribed pitch, based upon a driving amount of the driving source of the cutting blade and based upon detecting the knife edge by said sensing portion, after moving the cutting blade by a prescribed amount in a direction orthogonal to the blade length direction.

9. A cutting apparatus as set forth in claim 8, wherein said sensing portion is controlled to move linearly in the blade length direction, and wherein said sensing portion includes a top portion parallel to the surface of the index table and facing a direction orthogonal to the blade length direction.

10. A cutting apparatus as set forth in claim 8, wherein said sensing portion comprises an optical sensor that detects a position of the knife edge of the cutting blade, said optical sensor being provided in a movable body having an upward opening, said movable body being controlled to move in the blade length direction of the cutting blade, and said movable body including an inner space of a predetermined size not interrupting movement of the cutting blade in a direction orthogonal to the blade length direction.

11. A cutting apparatus as set forth in claim 8, wherein said index table includes extractable positioners for mounting said sensing portion thereon, before and after turning the index table by an angle of 90 degrees.

12. A cutting apparatus as set forth in claim 8 wherein said sensing portion detects edge breakage of the knife edge of the cutting blade when cutting the work-piece, when the edge breakage is more than an allowable range, and wherein a transmitter is configured to transmit information related to the cutting to an operator.

13. A cutting apparatus comprising a column and a support supporting a cutting blade, said support configured to control a tilting angle of the cutting blade in a blade length direction, and the cutting blade being driven to be vertically movable relative to the support by a driving source supported by said support, wherein a sensing portion, movable in a blade length direction of a lowering cutting blade, is mounted on a surface of a index table, wherein the index table, the sensing portion, the driving source of the cutting blade, and a tilter configured to control the tilting angle of the support are respectively linked with a controller;

wherein said controller processes a tilting angle data of the cutting blade in the blade length direction by detecting a plurality of points of a knife edge in the blade length direction, using said sensing portion mounted on the surface of the index table, both before and after turning the index table by an angle of 90 degrees, and wherein said controller further processes and stores a parameter of a lowering amount data of the cutting blade at a time of moving the cutting blade by a prescribed pitch, based upon a driving amount of the driving source of the cutting blade, by moving the cutting blade tilted by the tilting angle data by a prescribed amount in a direction orthogonal to the blade length direction, lowering the cutting blade from the original position, and bringing a knife edge into line contact with the index table.

14. A cutting apparatus as set forth in claim 13, wherein said sensing portion is controlled to move linearly in the blade length direction, and wherein said sensing portion includes a top portion parallel to the surface of the index table and directed to a direction orthogonal to the blade length direction.

15. A cutting apparatus as set forth in claim 13, wherein said sensing portion comprises an optical sensor that detects a position of the knife edge of the cutting blade, said optical sensor being provided in a movable body having an upward opening, said movable body being controlled to move in the blade length direction of the cutting blade, and said movable body including an inner space of a predetermined size not interrupting movement of the cutting blade in a direction orthogonal to the blade length direction.

16. A cutting apparatus as set forth in claim 13, wherein said sensing portion comprises a probe controlled to move linearly in the blade length direction, for detecting a displacement amount by being brought into contact with the knife edge of the cutting blade.

17. A cutting apparatus as set forth in claim 13, wherein said index table includes extractable positioners for mounting said sensing portion thereon, before and after turning the index table by an angle of 90 degrees.

18. A cutting apparatus as set forth in claim 13, wherein said sensing portion detects edge breakage of the knife edge of the cutting blade when cutting the work-piece and, when the edge breakage is more than an allowable range, and wherein a transmitter transmits information related to the cutting to an operator.

* * * * *